United States Patent
Stansell

(10) Patent No.: US 7,859,925 B1
(45) Date of Patent: Dec. 28, 2010

(54) ANTI-FUSE LATCH SELF-TEST CIRCUIT AND METHOD

(75) Inventor: Galen E. Stansell, Kirkland, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 145 days.

(21) Appl. No.: 11/726,525

(22) Filed: Mar. 21, 2007

Related U.S. Application Data

(60) Provisional application No. 60/787,883, filed on Mar. 31, 2006.

(51) Int. Cl.
*G11C 29/12* (2006.01)

(52) U.S. Cl. ............... 365/201; 365/225.7; 365/156; 365/154

(58) Field of Classification Search ............ 365/156, 365/154, 189.05, 201, 225.7
See application file for complete search history.

(56) References Cited

U.S. PATENT DOCUMENTS

| | | | |
|---|---|---|---|
| 3,636,530 A | 1/1972 | Mark et al. | |
| 3,676,717 A | 7/1972 | Lockwood | |
| 3,811,076 A | 5/1974 | Smith | |
| 3,846,768 A | 11/1974 | Krick | |
| 3,906,464 A | 9/1975 | Lattin | |
| 3,950,737 A | 4/1976 | Uchida et al. | |
| 4,000,413 A | 12/1976 | Wong et al. | |
| 4,044,343 A | 8/1977 | Uchida | |
| 4,051,388 A | 9/1977 | Inukai | |
| 4,095,281 A | 6/1978 | Denes | |
| 4,096,584 A | 6/1978 | Owen, III et al. | |
| 4,103,344 A | 7/1978 | Fagan et al. | |
| 4,110,639 A | 8/1978 | Redwine | |
| 4,112,507 A | 9/1978 | White et al. | |
| 4,128,773 A | 12/1978 | Troutman et al. | |
| 4,138,737 A | 2/1979 | McCann | |
| 4,146,802 A | 3/1979 | Moench | |
| 4,149,099 A | 4/1979 | Nagami | |
| 4,216,395 A | 8/1980 | Beecham et al. | |
| 4,262,219 A | 4/1981 | Richard | |

(Continued)

FOREIGN PATENT DOCUMENTS

JP  6136994 A1  7/1998

(Continued)

OTHER PUBLICATIONS

USPTO Miscellaneous Action for U.S. Appl. No. 11/343,341 dated Jan. 18, 2008; 2 pages.

(Continued)

*Primary Examiner*—Andrew Q Tran

(57) ABSTRACT

A programmable latch circuit (200) can include a volatile latch (206) that may regenerate a value determined by programmable section (202). In a test operation, a variable current source (216') can generate a current (IBASE) that can be mirrored in test sections (252-0 and 252-1) and compared to a current drawn by either programmable element (210-0) or (210-1) by a latching operation of volatile latch (206). Variable current source (216') can enable characterization of programmable elements (210-0 or 210-1) as well as adjustable test threshold limits. A program voltage (Vprog) applied to programmable elements (210-0 or 210-1) can be also be variable to allow for characterization of programmable elements (210-0 and 210-1) over a range of voltages.

20 Claims, 4 Drawing Sheets

U.S. PATENT DOCUMENTS

| | | | |
|---|---|---|---|
| 4,271,487 A | 6/1981 | Craycraft et al. | |
| 4,291,242 A | 9/1981 | Schriber | |
| 4,342,101 A | 7/1982 | Edwards et al. | |
| 4,347,448 A | 8/1982 | Plachno | |
| 4,354,255 A | 10/1982 | Stewart | |
| 4,433,252 A | 2/1984 | Lewis | |
| 4,435,786 A | 3/1984 | Tickle | |
| 4,472,643 A | 9/1984 | Furuyama | |
| 4,510,584 A | 4/1985 | Dias et al. | |
| 4,538,246 A | 8/1985 | Wang et al. | |
| 4,638,465 A | 1/1987 | Rosini et al. | |
| 4,701,858 A | 10/1987 | Stokes et al. | |
| 4,716,552 A | 12/1987 | Maltiel et al. | |
| 4,769,787 A | 9/1988 | Furusawa et al. | |
| 4,858,185 A | 8/1989 | Kowshik et al. | |
| 5,065,362 A | 11/1991 | Herdt et al. | |
| 5,111,257 A | 5/1992 | Andoh et al. | |
| 5,168,334 A | 12/1992 | Mitchell et al. | |
| 5,283,764 A | 2/1994 | Kim et al. | |
| 5,287,319 A | 2/1994 | Fukumoto | |
| 5,315,177 A | 5/1994 | Zagar et al. | |
| 5,353,248 A | 10/1994 | Gupta | |
| 5,365,475 A | 11/1994 | Matsumura et al. | |
| 5,387,534 A | 2/1995 | Prall | |
| 5,424,569 A | 6/1995 | Prall | |
| 5,426,605 A | 6/1995 | Van Berkel et al. | |
| 5,436,480 A | 7/1995 | Yu | |
| 5,467,300 A | 11/1995 | Komarek et al. | |
| 5,485,429 A | 1/1996 | Ono | |
| 5,496,756 A | 3/1996 | Sharma et al. | |
| 5,506,816 A | 4/1996 | Hirose et al. | |
| 5,510,638 A | 4/1996 | Lancaster et al. | |
| 5,511,020 A | 4/1996 | Hu et al. | |
| 5,517,448 A | 5/1996 | Liu | |
| 5,523,971 A | 6/1996 | Rao | |
| 5,617,357 A | 4/1997 | Haddad et al. | |
| 5,621,696 A | 4/1997 | Dhong et al. | |
| 5,644,533 A | 7/1997 | Lancaster et al. | |
| 5,648,930 A | 7/1997 | Randazzo | |
| 5,656,837 A | 8/1997 | Lancaster et al. | |
| 5,677,866 A | 10/1997 | Kinoshita | |
| 5,732,032 A * | 3/1998 | Park et al. | 365/201 |
| 5,734,617 A | 3/1998 | Zheng | |
| 5,760,644 A | 6/1998 | Lancaster et al. | |
| 5,774,397 A | 6/1998 | Endoh et al. | |
| 5,774,400 A | 6/1998 | Lancaster et al. | |
| 5,789,776 A | 8/1998 | Lancaster et al. | |
| 5,793,684 A | 8/1998 | Yach | |
| 5,812,477 A | 9/1998 | Casper et al. | |
| 5,875,144 A | 2/1999 | Zheng | |
| 5,892,712 A | 4/1999 | Hirose | |
| 5,978,298 A | 11/1999 | Zheng | |
| 5,986,932 A | 11/1999 | Ratnakumar et al. | |
| 6,011,742 A | 1/2000 | Zheng | |
| 6,016,264 A | 1/2000 | Lin | |
| 6,026,018 A | 2/2000 | Herdt | |
| 6,084,814 A | 7/2000 | Casper et al. | |
| 6,097,618 A | 8/2000 | Jenne | |
| 6,122,191 A | 9/2000 | Hirose et al. | |
| 6,172,907 B1 | 1/2001 | Jenne | |
| 6,181,627 B1 | 1/2001 | Casper et al. | |
| 6,194,738 B1 | 2/2001 | Debenhaum et al. | |
| 6,246,623 B1 | 6/2001 | Ingalls | |
| 6,363,011 B1 | 3/2002 | Hirose et al. | |
| 6,373,771 B1 | 4/2002 | Fifield et al. | |
| 6,420,925 B1 | 7/2002 | Fifield et al. | |
| 6,469,930 B1 | 10/2002 | Murray | |
| 6,490,203 B1 | 12/2002 | Tang | |
| 6,532,169 B1 | 3/2003 | Mann et al. | |
| 6,553,556 B1 | 4/2003 | Blodgett | |
| 6,556,487 B1 | 4/2003 | Ratnakumar et al. | |
| 6,574,145 B2 | 6/2003 | Kleveland et al. | |
| 6,621,324 B2 | 9/2003 | Fifield et al. | |
| 6,625,080 B2 | 9/2003 | Casper et al. | |
| 6,633,506 B2 | 10/2003 | Casper et al. | |
| 6,674,665 B1 | 1/2004 | Mann et al. | |
| 6,714,469 B2 * | 3/2004 | Rickes et al. | 365/201 |
| 6,741,117 B2 | 5/2004 | Lee | |
| 6,759,895 B2 | 7/2004 | Takami | |
| 7,146,585 B2 | 12/2006 | Blodgett | |
| 7,149,114 B2 | 12/2006 | Taheri et al. | |
| 7,339,848 B1 * | 3/2008 | Stansell et al. | 365/225.7 |
| 7,426,142 B1 * | 9/2008 | Stansell et al. | 365/185.21 |
| 2006/0114020 A1 | 6/2006 | Taheri et al. | |

FOREIGN PATENT DOCUMENTS

| | | |
|---|---|---|
| WO | WO 95/30244 | 11/1995 |
| WO | WO 97/15929 | 5/1997 |

OTHER PUBLICATIONS

USPTO Notice of Allowance for U.S. Appl. No. 11/343,341 dated Sep. 10, 2007; 7 pages.

U.S. Appl. No. 11/343,341: "Anti-Fuse Latch Circuit and Method Including Self-Test," Stansell et al.; 51 pages.

USPTO Requirement for Restriction/Election to U.S. Appl. No. 11/701,650 dated Sep. 22, 2008; 6 pages.

U.S. Appl. No. 11/701,650: "Method for Validating the Programming Status of Nonvolatile Memory Elements," Stansell; 44 pages.

USPTO Notice of Allowance for U.S. Appl. No. 11/415,694 dated May 6, 2008; 4 pages.

USPTO Non-Final Rejection for U.S. Appl. No. 11/415,694 dated Nov. 1, 2007; 9 pages.

U.S. Appl. No. 11/415,694: "Device and Method for Sensing Programming Status of Non-Volatile Memory Elements," Stansell et al.; 37 pages.

U.S. Appl. No. 09/892,164: "SONOS Latch and Application," Mann et al.; 6 pages.

U.S. Appl. No. 10/368,528: "SONOS Latch and Application," Mann et al.; 28 pages.

USPTO Notice of Allowance for U.S. Appl. No. 08/846,558 dated Jul. 20, 1998; 3 pages.

USPTO Requirement Restriction for U.S. Appl. No. 09/136,694 dated Aug. 17, 1999; 4 pages.

Frohman-Bentchkowsky, "The Methal-Nitrice-Oxide-Silicon (MNOS) Transistor - Characteristics and Applications," Proceedings of the IEEE, vol. 58, No. 8, Aug. 1970, pp. 1207-1219; 13 pages.

Donaldson et al., "SNOS7 1K X 8 Static Nonvolatile RAM," IEEE Journal of Solid-State Circuits, vol. SC-17, No. 5, Oct. 1982, pp. 847-851; 5 pages.

Hirose et al., "Non-Volatile Latch for FPGA Devices," NVX Corporation, Jan 10, 1995; 6 pages.

Hirose et al., "Non-Volatile Latch Description," NVX Corporation, Nov. 1, 1995; 23 pages.

Hirose et al., "Non-Volatile Latch for Semiconductor Devices," NVX Corporation, Sep. 8, 1994; 13 pages.

USPTO Notice of Allowance for U.S. Appl. No. 09/426,100 dated Jul. 19, 2000; 4 pages.

USPTO Non-Final Rejection for U.S. Appl. No. 09/426,100 dated Mar. 10, 2000; 7 pages.

USPTO Notice of Allowance for U.S. Appl. No. 09/136,694 dated Apr. 24, 2000; 4 pages.

USPTO Non-Final Rejection for U.S. Appl. No. 09/136,694 dated Nov. 12, 1999; 8 pages.

USPTO Notice of Allowance for U.S. Appl. No. 09/626,267 dated Aug. 7, 2001; 5 pages.

USPTO Non-Final Rejection for U.S. Appl. No. 09/626,267 dated Mar. 28, 2001; 5 pages.

USPTO Requirement for Restriction/Election for U.S. Appl. No. 09/626,267 dated Dec. 1, 2000; 4 pages.

USPTO Notice of Allowance for U.S. Appl. No. 09/137,914 dated Oct. 29, 1999; 1 page.

USPTO Non-Final Rejection for U.S. Appl. No. 09/137,914 dated Jun. 9, 1999; 4 pages.

"nvSRAM Basics," Simtek 1999 Data Book, Chapter 8; 8-1 through 8-5; 5 pages.

USPTO Notice of Allowance for U.S. Appl. No. 07/361,033 dated Apr. 30, 1991; 4 pages.

USPTO Final Rejection for U.S. Appl. No. 07/361,033 dated Jan. 18, 1991; 5 pages.

USPTO Non-Final Rejection for U.S. Appl. No. 07/361,033 dated Jun. 12, 1990; 11 pages.

USPTO Notice of Allowance for U.S. Appl. No. 08/234,288 dated Oct. 2, 1995; 1 page.

USPTO Final Rejection for U.S. Appl. No. 08/234,288 dated May 31, 1995; 3 pages.

USPTO Non-Final Rejection for U.S. Appl. No. 08/234,288 dated Oct. 6, 1994; 2 pages.

USPTO Notice of Allowance for U.S. Appl. No. 08/715,569 dated Aug. 19, 1997; 1 page.

USPTO Notice of Allowance for U.S. Appl. No. 08/735,973 dated Nov. 21, 1997; 3 pages.

Svensson et al., "Trap-Assisted Charge Injection in MNOS Structures," Oct. 1973, J. Appl. Phys., vol. 44, No. 10; 7 pages.

Lundstorm et al., "Properties of MNOS Structures," Jun. 1972, IEEE Transactions on Electron Devices, vol. Ed-19, No. 6; 11 pages.

Takahashi et al., "Estimation of Insulation Layer Conductrance in MNOS Structure," Nov. 1993, IEEE Transactions on Electron Devices, vol. 40, No. 11; 5 pages.

USPTO Notice of Allowance for U.S. Appl. No. 08/988,942 dated Jan. 3, 2000; 2 pages.

USPTO Non-Final Rejection for U.S. Appl. No. 08/988,942 dated Oct. 15, 1999; 5 pages.

USPTO Non-Final Rejection for U.S. Appl. No. 08/988,942 dated Apr. 29, 1999; 4 pages.

USPTO Requirement for Restriction/Election for U.S. Appl. No. 08/988,942 dated Feb. 8, 1999; 3 pages.

USPTO Non-Final Rejection for U.S. Appl. No. 08/926,611 dated Jul. 7, 1998; 5 pages.

USPTO Notice of Allowance for U.S. Appl. No. 08/926,611 dated Dec. 14, 1998; 3 pages.

Herdt et al., "A 256K Nonvolatile Static RAM," Simtek Corporation, No. 5.3, 1995, pp. 1-4; 4 pages.

Ohnakado et al., "Novel Electron Injection Method Using Band-to-Band Tunneling Induced Hot Electron (BBHE) for Flash Memory with a P-Channel Cell," IEDM 95-279, pp. 11.5.1-11.5.4; 4 pages.

Betty Prince, "Semiconductor Memories: A Handbook of Design, Manufacture and Application, " Second Edition, Texas Instruments, John Wiley & Sons, 1983, pp. 611-620; 11 pages.

U.S. Appl. No. 11/343,341: "Anti-Fuse Latch Circuit and Method Including Self-Test," Stansell et al.; 51 pages, Jan. 30, 2006.

U.S. Appl. No. 11/701,650: "Method for Validating the Programming Status of Nonvolatile Memory Elements," Stansell; 44 pages, Feb. 2, 2007.

U.S. Appl. No. 11/415,694: "Device and Method for Sensing Programming Status of Non-Volatile Memory Elements," Stansell et al.; 37 pages, May 1, 2006.

U.S. Appl. No. 09/892,164: "SONOS Latch and Application," Mann et al.; 26 pages, Jun. 26, 2001.

U.S. Appl. No. 10/368,528: "SONOS Latch and Application," Mann et al.; 28 pages, Feb. 18, 2003.

* cited by examiner

ANTI-FUSE LATCH SELF-TEST CIRCUIT AND METHOD

This application claims the benefit of U.S. Provisional Patent Application Ser. No. 60/787,883 filed on Mar. 31, 2006, the contents of which are incorporated by reference herein.

TECHNICAL FIELD

The present invention relates generally to latch circuits and more particularly to latch circuits that can operate in conjunction with programmable elements, such as antifuses, or the like.

BACKGROUND OF THE INVENTION

Electronic systems can typically include a data storage capability. For example, bi-stable circuits, such as flip-flops can maintain a data value in one of two binary logic values depending upon an input to the flip-flop. One commonly used bi-stable circuit that can maintain a logic value until another value is written or rewritten, is a latch.

A latch can take a number of different forms. For example, a latch can include cross-coupled inverters that can latch a data value on complementary data nodes until a new data value is rewritten. Such latches are often used as static random access memory (SRAM) cells. An SRAM type latch can store true and complementary logic values. Such stored data values can be read when, for example, an execution unit fetches data from an addressed storage cell.

Unlike memory cells that can require periodic refresh, an SRAM type latch can retain stored data without requiring refresh until such a time as power is removed from the latch. However, there are many applications in which it is desirable for a data value to be retained even in the absence of power. Thus, many conventional applications include both a volatile storage circuit and a nonvolatile storage circuit.

Typically, a volatile memory is situated within an integrated circuit that is separate from an integrated circuit including a nonvolatile memory. There may be instances, however, where both volatile and nonvolatile storage elements are included in the same integrated circuit. In such instances, data targeted for volatile storage elements can be generally altogether different from the data targeted for the volatile storage elements. For example, the different data sets may be for different applications.

However, in some applications, it may be desirable to utilize a storage device having both volatile and nonvolatile features for the same data value. For example, if data is to be temporarily held while power is present, a storage device can utilize a latch into which data can be written and thereafter read. However, if the data stored is of sufficient importance, the data could be maintained after power is removed by storing the data value into a nonvolatile storage element. Such a desired storage device could function essentially as a latch, but also include nonvolatile storage for latched data. Such a circuit can be considered a "programmable" latch.

Conventional programmable latches can utilize antifuse devices as nonvolatile storage elements. An antifuse device can have a first, relatively high impedance, in an unprogrammed state, and a second, relatively low impedance, in a programmed state. Due to process and other variations, the programming response for antifuse devices can vary. As a result, it is desirable to be able to test a state (e.g., impedance) of an antifuse device to ensure it has a low enough impedance after being programmed and/or a high enough impedance if not programmed.

Conventional antifuse based programmable latches and corresponding test arrangements will now be described with reference to FIGS. 7 and 8.

FIG. 7 shows a conventional programmable latch circuit 700 and corresponding test configuration. A conventional programmable latch circuit 700 can include an antifuse section 702, a load section 704, volatile latch 706, first test section 708, and second test section 710. One of the antifuse devices (AF1 or AF2) in antifuse section 702 can be programmed to establish a stored logic value. Such a value can be latched by volatile latch 706 by operation of load section 704. Ideally, a programmed antifuse device can draw a current greater than some minimum current, while an unprogrammed antifuse device can draw a current less than the minimum current (can be essentially zero).

As shown in FIG. 7, in a test operation, a power supply voltage vpwr can be applied to both the volatile latch circuit 706 and antifuse section 702. In addition, a test voltage vmrg can be applied to gates of transistors P70 and P71 to generate a test current Itest (not shown) when the circuit is closed by test control signals mrglb or mrgrb. According to test control signals mrglb and mrgrb, test current Itest can be applied to one latch node 712 or the other latch node 714. Ideally, a test current (Itest) can have a magnitude between that of an ideal programmed current value and an ideal unprogrammed current value.

More particularly, if antifuse device AF1 is being tested, second test section 710 can be enabled by signal mrgrb, while first test section 706 can be disabled by signal mrglb. If antifuse device AF1 is programmed properly, a current provided to node 712 by antifuse device AF1 will be greater than that provided to node 714 by test section 710. Volatile latch 706 can latch a data value according to a differential voltage between such nodes. In contrast, if antifuse device AF1 is not programmed properly, a current provided to node 712 can be less than that provided to node 714, and volatile latch 706 can latch an opposite data value. In the same fashion, if antifuse device AF2 is being tested, first test section 708 can be enabled by signal mrglb, while second test section 710 can be disabled by signal mrglb.

A conventional testing operation will now be described. In particular, in the testing of anti-fuse AF1, a sequencing of signals hldb, eq, ldb, and mrgrb can be used to evaluate a resistance of AF1. One such sequence would be to first set hldb voltage sufficiently high enough to turn off p-channel metal-oxide-semiconductor (PMOS) devices P72 and P73 within volatile latch 706. Second, signal eq can be driven to a voltage sufficiently high enough to turn on the n-channel MOS (NMOS) devices N70 and N71 within volatile latch 706, and remain high for a time sufficiently long enough to set the voltage at nodes 712 and 714 to a same or similar potential as vgnd.

Next, with eq still high, signals ldb and mrgrb can be driven to a voltage sufficiently low enough to enable load section 704 and to enable test PMOS device P74. Signal mrglb can remain at a voltage sufficiently high enough to disable the PMOS device P75 controlled by mrglb. Next signal eq would be set to a voltage sufficiently low to turn off NMOS devices N70 and N71. The circuit can remain in this state sufficiently long enough for current flowing through antifuse AF1 to charge up node 712 to a voltage Vtn high enough to turn on NMOS N72 of volatile latch 706, or for current flowing through second test circuit 710 to charge up node 714 to a voltage Vtn high enough to turn on NMOS device N73 in volatile latch 706. If node 712 reaches Vtn prior to node 714, then NMOS device N72 can turn on and discharge node 714 once again, reinforcing the state programmed into AF1 and showing that AF1 was of sufficiently low resistance. If node 714 reaches Vtn prior to node 712, then NMOS device N73 can turn on and discharge node 712 once again, reinforcing the test current, showing that AF1 was not of sufficiently low resistance.

A next step in this conventional sequence would be to set ldb and mrgrb to a voltage sufficiently high enough to turn off PMOS devices in load section 704 and PMOS device P74, Next, signal hldb can be set to a voltage low enough to enable PMOS devices P76 and P77 in volatile latch 706. This can hold the states of nodes 712 and 714 as determined in the prior steps. Finally, the signal out can be read by an external tester and compared to an expected state. If AF1 had a sufficiently low resistance, a low would be read on the out signal and the test would pass. Otherwise, a high would be read on the out signal and the test would fail.

A similar sequence can be executed for anti-fuse AF2, wherein a high on the out signal would indicate a passing test, while a low would indicate a failing test.

It is understood that both a power supply voltage (vpwr) and a test voltage (vmrg) are applied via external connections (e.g., from external test equipment). Thus, FIG. 7 shows a line 716 signifying a physical boundary of an integrated circuit containing the programmable latch.

A second conventional programmable latch circuit 800 and corresponding test arrangement is shown in FIG. 8. Conventional programmable latch circuit 800 can include antifuse section 802, load section 804, and a volatile latch 806. In addition, circuit 800 further includes first test section 808, and second test section 810.

In a test operation, a power supply voltage vpwr can be applied to volatile latch circuit 806 while a test voltage vpp can be applied to antifuse section 802. The programmed state of the anti-fuses can be loaded into the volatile latch through load section 804 by sequencing the ldb and hldb signals with a test voltage (vpp) applied. A test signal (test) can be asserted (driven high in this example). As a test voltage (vpp) is being applied, a current ipp can be measured at the vpp voltage source. If an antifuse device has been properly programmed, a current ipp will be greater than some minimum value.

The above conventional arrangements can have drawbacks however. In the conventional case of FIG. 7, in some test equipment, control of an applied test voltage (vmrg) may not be sufficiently precise to generate small enough test current values for acceptable test results. Thus, errors in such an applied test voltage can result in improper test results. In addition, because an applied test voltage (vmrg) can be referenced to external ground, such a test voltage can be subject to undue noise.

A drawback to the conventional arrangement of FIG. 8 is that such an approach can be slow. Because current measurement is performed by an applied voltage, a test is performed on one nonvolatile element at a time. Such added test time can translate into increased cost. Further, to ensure adequate accuracy in a current measurement, a tester may have to include a precision current sensing capability. This can require a more costly tester.

U.S. Patent Application filed on Jan. 30, 2006, having Ser. No. 11/343,341 titled ANTI-FUSE LATCH CIRCUIT AND METHOD INCLUDING SELF-TEST, by Stansell et al., now U.S. Pat. No. 7,339,848 issued on Mar. 4, 2008, discloses a programmable latch with self-test capabilities. The contents of this application are incorporated by reference herein.

DETAILED DESCRIPTION

Various particular embodiments of the present invention are set forth below in a number of diagrams. The embodiments include programmable latches having self-test capabilities and related methods.

Figure 1:
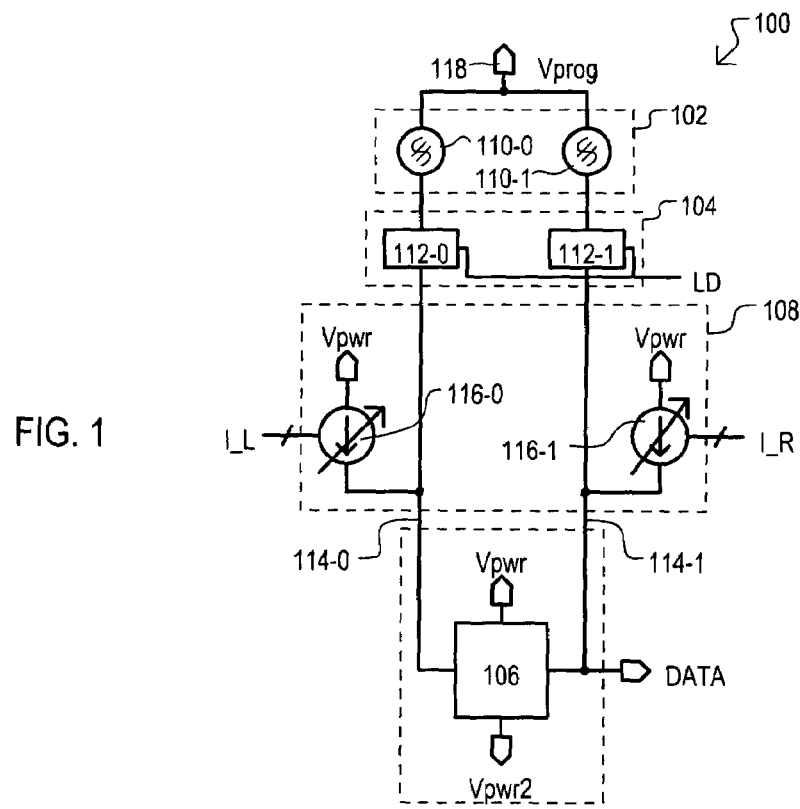
FIG. 1 is a block schematic diagram of a programmable latch circuit according to a first embodiment.

Referring now to FIG. 1, a programmable latch circuit according to a first embodiment is set forth in a block schematic diagram and designated by the general reference character 100. A programmable latch circuit 100 can include a programmable section 102, a data load section 104, a volatile latch circuit 106, and a test circuit 108. A programmable section 102 can store a data value, in a nonvolatile fashion, that can be recalled (e.g., loaded) into volatile latch 106. In the embodiment of FIG. 1, a programmable section 102 can include two programmable elements 110-0 and 110-1 that can be programmed to opposite impedance states (e.g., one high having a high impedance with respect to the other). Preferably, programmable elements (110-0 and 110-1) can be antifuse devices fabricated with an initial high impedance and programmable to a lower impedance.

A data load section 104 can enable data value programmed within programmable section 102 to be applied to volatile latch 106. A data load section 104 can include a first load switch 112-0 and a second load switch 112-1. In a load operation, load switches (112-0 and 112-1) can provide a low impedance. Consequently, one node (114-0 or 114-1) of volatile latch can be pulled higher than the other, and such a differential potential can be latched as a "recalled" or "loaded" data value. It is noted that load switches (112-0 and 112-1) can be commonly controlled by one signal, or separately controlled by different signals.

A test section 108 can include one or more variable current sources. A variable current source can include a current source that provides a current with a magnitude that is selectable according to a selectable test value. Preferably, such a current source can be a precision current source that can supply a current with greater precision than a bias voltage applied to a transistor gate. Still further, a current source is preferably formed in the same integrated circuit as the other components of the programmable latch. Thus, a test capability is built in: enables built-in self-test (BIST).

In the very particular example of FIG. 1, a test section 108 can include a first variable current source 116-0 that can be connected to a first node 114-0, and a second variable current source 116-1 that can be connected to a second node 114-1. One of variable current sources (116-0 or 116-1) can be enabled (provide current) according to which programmable element (110-0 or 110-1) is being tested.

In particular, if programmable element 110-0 has been subject to a program operation, it can be tested with variable current source 116-1. Even more particularly, a test voltage can be provided at a program voltage node 118, and load switch 112-0 (and optionally load switch 112-1) can be enabled to provide a low impedance. As a result, a current path can be created between programmable element 110-0 and volatile latch data node 114-0. In addition, variable current source 116-1 can be adjusted to provide a test current to volatile latch data node 114-1 based on an applied value I_R. If programmable element 110-0 has been properly programmed, it can source more current than that provided by variable current source 116-1, and a differential voltage can be generated across nodes 114-0 and 114-1. This value (e.g., DATA high) can be latched by volatile latch 106 to indicate proper programming. However, if programmable element 110-0 has not been properly programmed, it will source less current than that provided by variable current source 116-1, and an opposite differential voltage can be generated across nodes 114-0 and 114-1. This value (e.g., DATA low) can be latched by volatile latch 106 to indicate improper programming. In one particular embodiment, value I_R can be a multi-bit digital value.

In the case of an opposite logic value to that above, programmable element 110-1 can be subject to a program operation, and tested with variable current source 116-0 in the same general fashion as described above.

It is understood that variable current sources 116-0 and 116-1 can generate a range of a test currents that can be set according to a desired condition.

Figure 2:
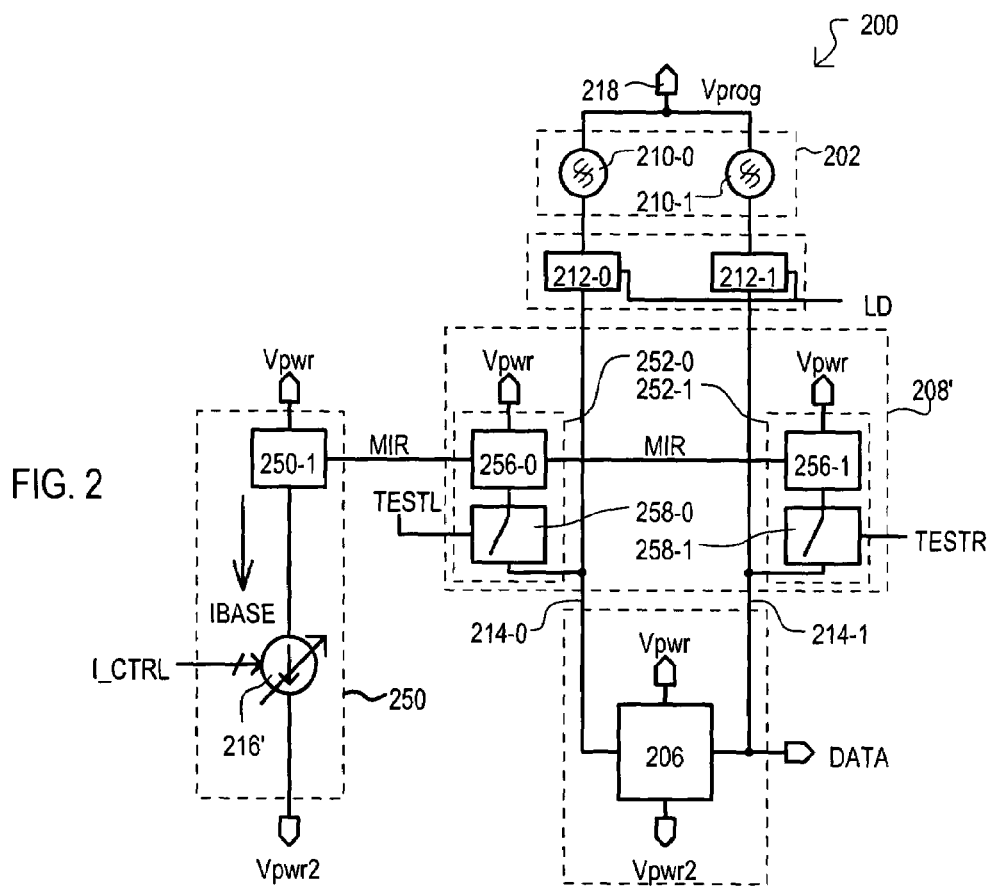
FIG. 2 is a block schematic diagram of a programmable latch circuit according to a second embodiment.

A programmable latch circuit according to a second embodiment is shown in FIG. 2, and designated by the general reference character 200. Programmable latch circuit 200 can include some of the same or similar circuit sections as FIG. 1. Such same/similar sections are referred by the same reference character but with the first digit being a "2" instead of a "1".

A programmable latch circuit 200 can include a test section 208' that generates test currents by mirroring a variable current source to thereby generate test currents that can be applied at either node 214-0 or 214-1 of volatile latch 206.

In the particular example of FIG. 2, a current generator 250 can be provided that includes a variable current source 216' and mirror device 250-1. A variable current source 216' can generate a current IBASE selected according to a value I_CTRL. Preferably, a variable current source 216' can be a precision current source. In response to a current drawn by current source 216', mirror device 250-1 can generate an output value MIR that follows current IBASE. Such a value can be utilized by a test section 208' to provide test currents to node 214-0 or 214-1 of volatile latch 206.

In the example of FIG. 2, a current IBASE can be mirrored according to test sections 252-0 and 252-1. In particular, within section 252-0, a mirror device 256-0 can generate a test current that tracks current IBASE according to value MIR. A switch device 258-0 can provide the mirrored test current to a node 214-0 according to a signal TESTL. Section 252-1 can operate in the same general fashion, but with respect to node 214-1 and signal TESTR. It is understood that mirror devices (256-0 and 256-1) can provide a same current as current IBASE, or can scale such a current.

In this way, a single variable current source can be mirrored to provide test currents to one or more data storage nodes of a volatile latch or a plurality of volatile latches coupled to programmable elements.

Figure 3:
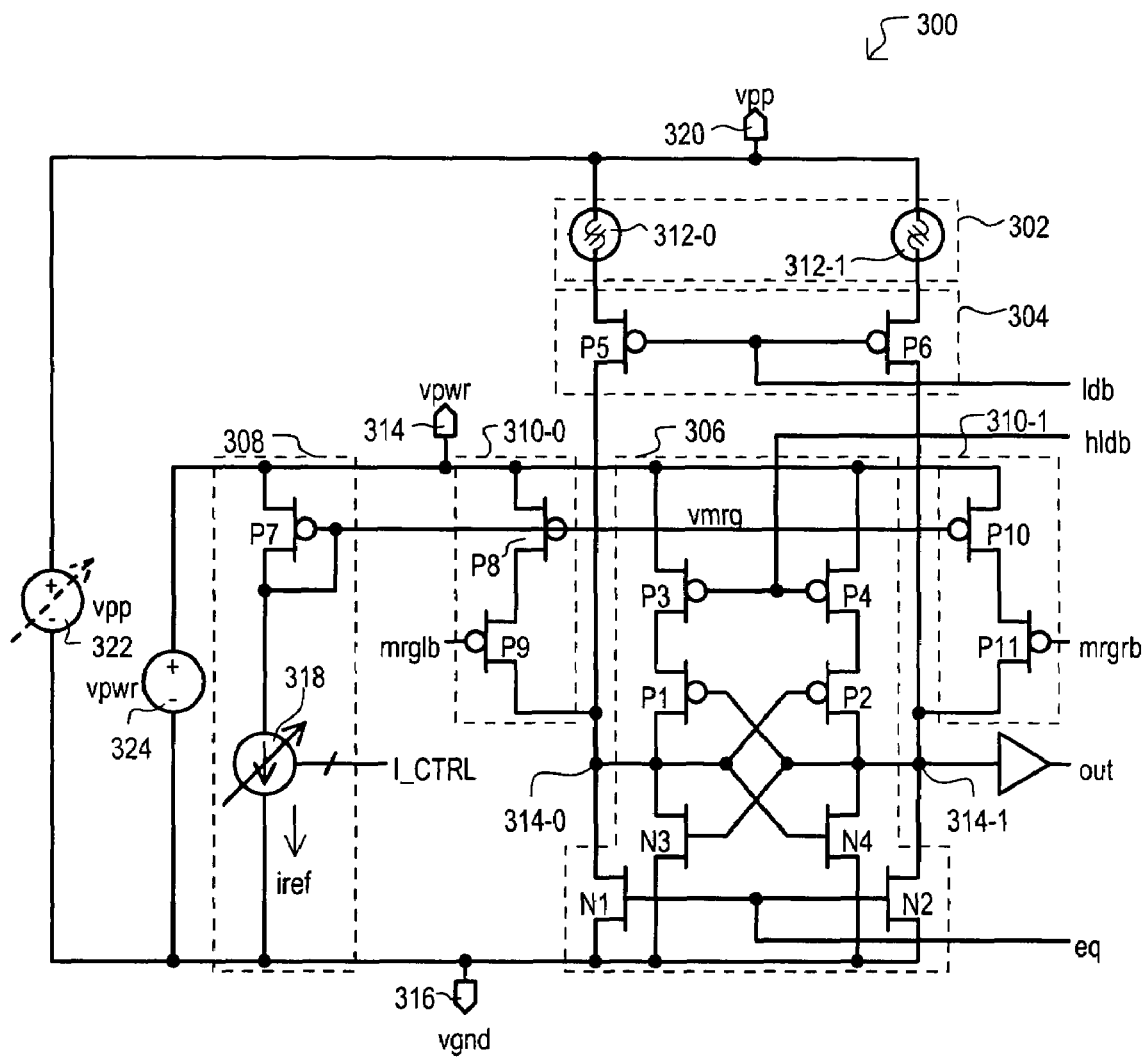
FIG. 3 is a schematic diagram of a programmable latch circuit according to a third embodiment.

A programmable latch circuit according to a third embodiment is shown in FIG. 3, and designated by the general reference character 300. Programmable latch circuit 300 can include an antifuse section 302, a data load section 304, a volatile latch circuit 306, a variable current source section 308, a first test section 310-0 and a second test section 310-1. An antifuse section 302 can include two antifuse elements 312-0 and 312-1 that can be programmed to opposite impedance states (e.g., one having a high impedance with respect to the other).

A data load section 304 can include p-channel insulated gate field effect transistors P5 and P6 (referred to hereinafter as PMOS transistor, but not implying any particular gate insulator arrangement). PMOS devices P5 and P6 can be enabled (provide a low impedance path) according to an active low load signal ldb.

A volatile latch circuit 306 can include cross coupled inverters formed by n-channel insulated gate field effect transistors N3, N4 (referred to hereinafter as NMOS transistor, but not implying any particular gate insulator arrangement) and PMOS devices P1 and P2. The particular latch circuit 306 of FIG. 3 also includes PMOS hold devices P3 and P4, which enable latch circuit 306 to hold a particular value. Volatile latch circuit 306 can further include equalization NMOS devices N1 and N2, which can equalize data nodes 314-0 and 314-1.

A variable current source section 308 can include a variable current source 318 and a mirror PMOS device P7. A variable current source 318 can generate a current iref having a value determined by input I_CTRL. According to such a current, PMOS device P7 can generate a bias potential vrmg at its commonly connected drain-gate.

First test section 310-0 and second test section 310-1 can generate test currents that mirror current iref. A first test section 310-0 can include a mirror PMOS device P8 and first current switch PMOS device P9. In a similar fashion, second test section 310-1 can include a mirror PMOS device P10 and second current switch PMOS device P11. In such an arrangement, PMOS device P9 can be enabled by test signal mrglb to provide a test current to node 314-0, while PMOS device P11 can be enabled by test signal mrgrb to provide a test current to node 314-1.

It is noted that a test current provided by mirror PMOS devices P8 and P10 can have the same essential magnitude as iref, or can be a scaled version of iref by scaling PMOS devices P8 and P10 with respect to PMOS device P7.

Preferably, antifuse section 302, a data load section 304, a volatile latch circuit 306, a variable current source section 308, a first test section 310-0 and a second test section 310-1 can all be formed in the same integrated circuit substrate.

FIG. 3 also shows a program voltage power supply 322 and a high power supply 324. A program power supply 322 can apply a programming voltage between program power supply node 320 and low power supply node 316. In a program operation, a program power supply voltage vpp can be substantially higher than a power supply voltage vpwr. In one arrangement, in a test operation, a program voltage vpp can be the same as power supply voltage vpwr. However, in another arrangement, a program voltage vpp can be varied in a test operation. A high power supply 324 can apply a power supply voltage between power supply node 314 and low power supply node 316.

Having described the structure of programmable latch circuit 300, the operation of such a circuit in one particular test operation will now be described. In the test operation, programmable latch circuit 300 can utilize a precision current reference iref to the test state of an antifuse element (312-0 or 312-1).

In a test operation, it is assumed that one of antifuse elements (312-0 or 312-1) has been programmed into an expected state. In addition, prior to the testing taking place, variable current supply 318 can be set to generate a desired current iref that can be mirrored within test sections 310-0 and 310-1.

A test operation can test an actual programmed state to an expected state. In such an operation, a hold signal hldb can be deasserted (driven high, in this example), turning off PMOS hold devices P3 and P4. Next, equalization signal eq can be asserted (driven high, in this example), turning on NMOS device N1 and N2, thus setting node 314-0 and 314-1 to a same potential close to or at a low power supply voltage. At this time, program power supply node 320 can be at a high (but not programming) voltage. At this time, load signal Idb and test signals mrgib and mrgrb can be deasserted (driven high, in this example). In this way, a volatile latch circuit 306 can be pre-conditioned to a neutral state, while being isolated from antifuse section 302 and test sections 310-0 and 310-1.

Next, with equalization signal eq still active, a load signal Idb can be asserted (driven low), and one of test signals mrglb or mrgrb (but not both) can be asserted (driven low). More particularly, if antifuse element 312-0 is to be tested, test signal mrgrb can be asserted. If antifuse element 312-1 is to be tested, test signal mrglb can be asserted.

Subsequently, equalization signal eq can be deasserted (driven low), turning off devices N1 and N2. Current can flow through the tested antifuse element (312-0 or 312-1), and at the same time, a current can flow through a selected test section (310-1 or 310-0). In such a state, one node (314-0 or 314-1) can rise in potential due to a current provided by a programmed antifuse element, while the other node (314-1 or 314-0) can rise due to an enabled test section. Eventually, one of devices N3 or N4 will be turned on. If the programmed antifuse element is operating properly, cross-coupled devices N3 and N4 can regenerate the data represented by the programmed antifuse element. In contrast, an improperly programmed antifuse device will result in less current than that generated by the selected test section. Cross-coupled devices N3 and N4 can thus regenerate the opposite data value to that intended by the programmed antifuse element.

Once a test data value has been regenerated by devices N3/N4, a load signal Idb and test signals mrglb and mrgrb can be deasserted (driven high). Isolating volatile latch circuit 306 from antifuse elements (312-0 and 312-1) and test sections (310-0 and 310-1). Next, hold signal hdlb can be asserted (driven low) to thereby hold a data value within voltage latch circuit 306. The test value can thus be latched, and subsequently read through an output port and compared to an expected result. In one particular example, such a comparison can be executed by external digital test equipment.

Preferably, variable current source 318 can be programmable, thus enabling the pass/fail current threshold to be changed according to antifuse variation (e.g., variation in programmed antifuse impedance).

As noted above, a program voltage vpp can also be variable, enabling the testing of antifuse impedance over a range of different potentials. In such a way, antifuse voltage coefficients can be thoroughly tested and characterized.

Figure 4A:
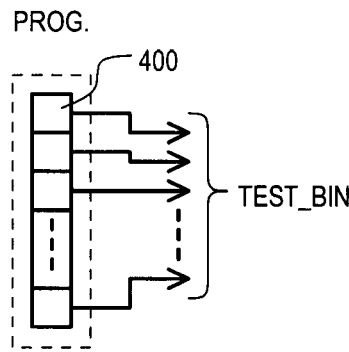
FIGS. 4a and 4b are block schematic diagrams showing the generation of a binary test current setting value according to embodiments.
Figure 4B:
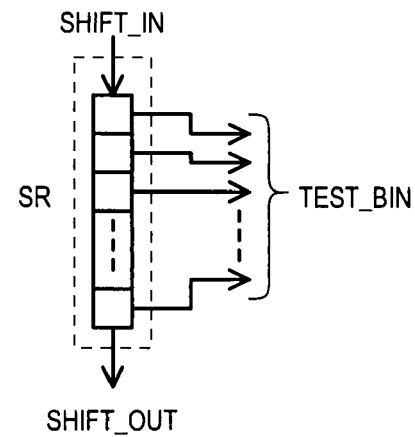

In particular embodiments, a value utilized to generate a test current (e.g., I_L, I_R, I_CTRL) can be a programmable binary value. FIGS. 4a and 4b show two of the many possible ways in which such a value can be generated. FIG. 4a shows an arrangement in which each bit of a binary test value TEST_BIN can be provided by a corresponding storage element, one of which is shown as 400. Such a storage element can be a volatile element or a nonvolatile element. As but a few examples, a voltage element can be a latch or a memory cell with an appropriate sense amplifier. A few of the many possible examples of a nonvolatile element can include a fuse, nonvolatile memory cell, mask option, or antifuse. A current setting value can be loaded into the storage elements in parallel or in series.

FIG. 4b shows a serial shift-register arrangement that can be utilized to provide a current setting value TEST_BIN. A desired current setting value can be shifted in prior to a test, and then shifted out after a test.

Figure 5A:
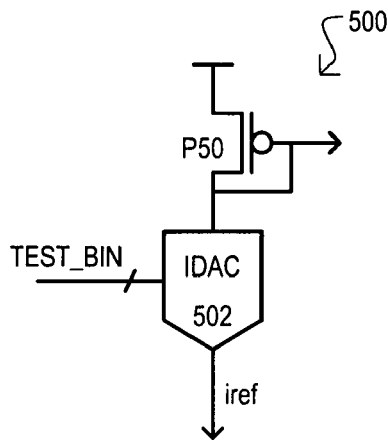
FIGS. 5a and 5b are block schematic diagrams showing the generation of a binary test current setting value according to another embodiments.
Figure 5B:
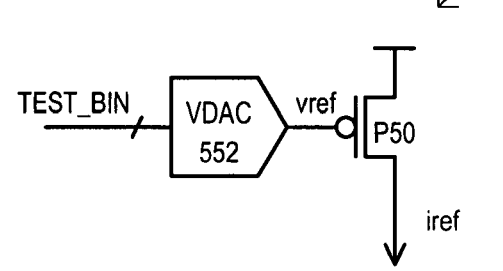

FIGS. 5a and 5b show but two of the many possible precision current sources that can be utilized in the above embodiments to generate a test current. FIG. 5a shows a current source 500 that can include a current digital-to-analog converter (IDAC) 502 that can generate a current iref according to an applied digital input value TEST_BIN. FIG. 5a shows an arrangement in which such a value can be mirrored by a mirror PMOS device P50.

FIG. 5b shows a current source 550 that can include a voltage digital-to-analog converter (VDAC) 552 that can generate a voltage vref according to an applied digital input value TEST_BIN. Such a voltage can then be applied to the gate of a PMOS device P5 to generate a current iref.

Figure 6:
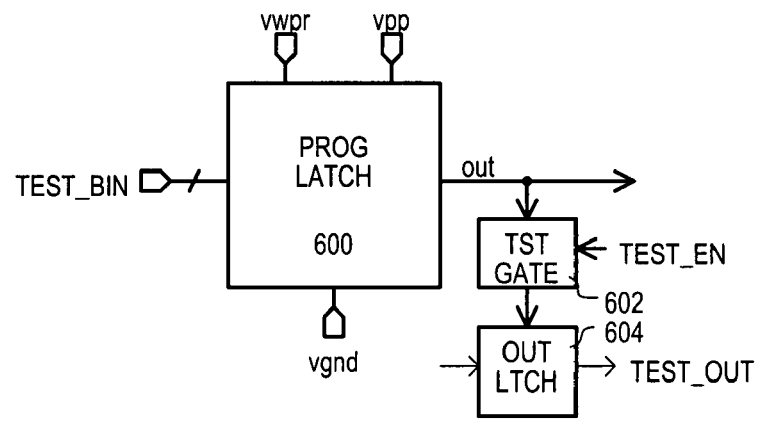
FIG. 6 is a block schematic diagram of a test data output circuit according to one embodiment.
Figure 7:
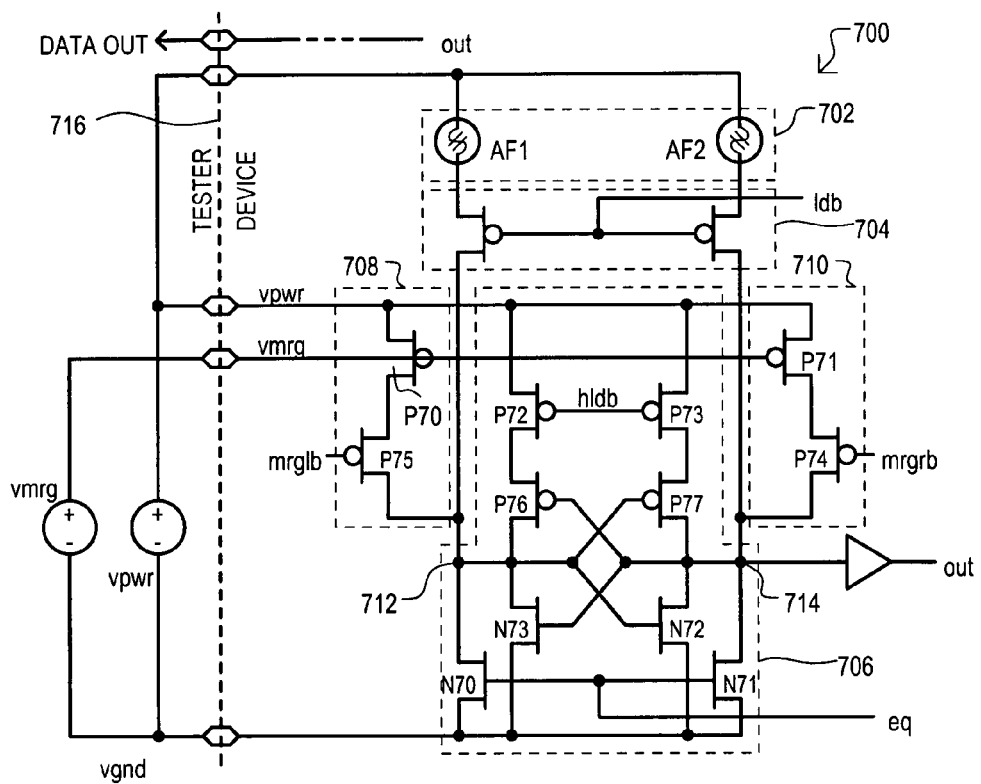
FIG. 7 shows a first conventional programmable latch circuit and test arrangement.
Figure 8:
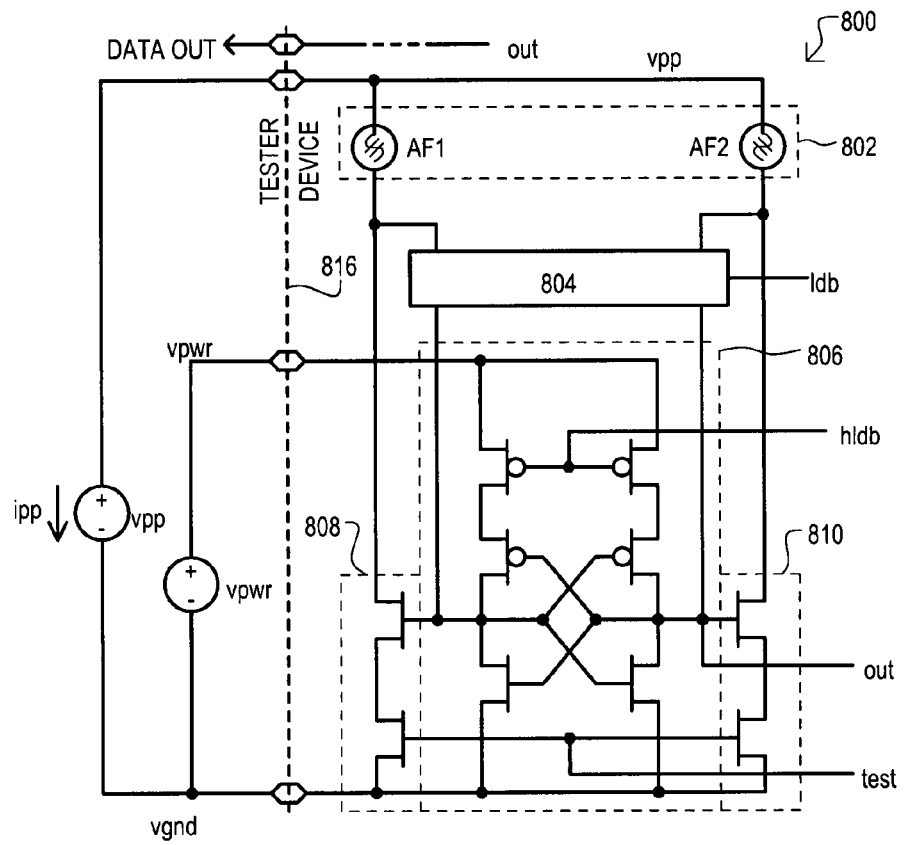
FIG. 8 shows a second conventional programmable latch circuit and test arrangement.

FIG. 6 shows one particular arrangement for capturing a test value from a programmable latch. FIG. 6 shows a programmable latch circuit 600 which can include any of the embodiments of FIGS. 1-3. In addition, a test gate 602 can provide a path between a data output of programmable latch 600 and an output data latch 604. At the end of a test operation, test gate 602 can be enabled, allowing a test value to be captured within output data latch 604.

It should be appreciated that reference throughout this specification to "one embodiment" or "an embodiment" means that a particular feature, structure or characteristic is described in connection with the embodiment is included in at least one embodiment of the present invention. Therefore, it is emphasized that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present invention.

Similarly, while the various aspects of the particular embodiments set forth herein have been described in detail, the present invention could be subject to various changes, substitutions, and alterations without departing from the spirit and scope of the invention.

What is claimed is:

1. A programmable latch circuit, comprising:
   a volatile latch circuit that latches a data value according to a potential difference between a first data node and a second data node;
   an anti-fuse circuit that includes a first anti-fuse structure coupled between a program node and the first data node, and a second anti-fuse structure coupled between the program node and the second data node; and
   a test circuit that includes at least a first test current path coupled to the first node that provides a first test current to the first node in response to a first test signal, and a controllable current source that establishes the magnitude of the first test current.

2. The programmable latch circuit of claim 1, wherein:
   the first test current path includes a first current source coupled in series with a first switch circuit, the first switch circuit being enabled in response to the first test signal.

3. The programmable latch circuit of claim 2, wherein:
the first current source comprises a first source transistor; and
the first switch circuit comprises a first switch transistor having a gate coupled to the first test signal.

4. The programmable latch circuit of claim 1, wherein:
the test circuit further includes a second test current path coupled to the second node that provides a second test current to the second node in response to a second test signal, the controllable current source establishing the magnitude of the second test current.

5. The programmable latch circuit of claim 4, wherein:
the second test current path includes a second current source coupled in series with a second switch circuit, the second switch circuit being enabled in response to the second test signal.

6. The programmable latch circuit of claim 5, wherein:
the second current source comprises a second source transistor; and
the second switch circuit comprises a second switch transistor having a gate coupled to the second test signal.

7. The programmable latch circuit of claim 1, wherein:
the test circuit further comprises
a first current supply transistor having a source-drain path coupled between a first supply voltage node and the first node, the first current supply transistor providing the first test current to the first node,
a bias transistor having a source-drain path coupled between the first supply voltage node and the controllable current source, the gate of the bias transistor being coupled to its drain and to the gate of the first current supply transistor.

8. The programmable latch circuit of claim 7, wherein:
the test circuit further comprises a second current supply transistor having a source-drain path coupled between the first supply voltage node and the second node and a gate coupled to the gate of the bias transistor, the second current supply transistor providing a second test current to the second node.

9. A programmable latch circuit, comprising:
a volatile latch circuit comprising a pair of latch transistors cross-coupled between a first data node and a second data node and formed in an integrated circuit substrate;
at least a pair of anti-fuse structures coupled between a program voltage node and the first data node and the second data node; and
at least one variable current source formed in the integrated circuit substrate that controls a magnitude of a first test current provided to the first data node and a magnitude of a second test current provided to the second data node.

10. The programmable latch circuit of claim 9, wherein:
the variable current source comprises a current digital-to-analog converter (DAC).

11. The programmable latch circuit of claim 10, further including:
a plurality of current set registers coupled to a digital input of the current DAC.

12. The programmable latch circuit of claim 11, wherein:
the current set registers are arranged as serial registers.

13. The programmable latch circuit of claim 9, wherein:
at least one of the data nodes of the volatile latch circuit is coupled to a test output register.

14. The programmable latch circuit of claim 9, further including:
a test circuit that includes
a mirror transistor having a gate and drain coupled to the variable current source,
a first test transistor having a source-drain path coupled to the first data node and a gate coupled to the gate of the mirror transistor, and
a second test transistor having a source-drain path coupled to the second data node and a gate coupled to the gate of the mirror transistor.

15. A method of testing antifuse devices of a programmable latch circuit, comprising the steps of:
generating a programmed current according to the state of at least one antifuse device of the programmable latch circuit, the programmed current flowing through one storage node of a volatile latch circuit;
generating a test current with a variable current source formed in the same substrate as the programmable latch circuit, the test current flowing through a different storage node of the volatile latch circuit; and
latching a test data value based on a potential difference between the one storage node and the different storage node of the volatile latch circuit.

16. The method of claim 15, wherein:
generating the programmed current includes
applying a potential at a first terminal of the antifuse device, and
enabling a current path between a second terminal of the antifuse device and the one storage node.

17. The method of claim 15, wherein:
generating the test current includes
receiving a current select value, and
adjusting the test current in response to the current select value.

18. The method of claim 15, further including:
applying a programming voltage to one of at least two antifuse devices in a programming operation to program the one antifuse device;
generating the programmed current according to the one programmed antifuse device.

19. The method of claim 18, wherein:
varying the programming voltage between a plurality of values;
generating a test current with the variable current source for each programming voltage; and
latching a test data value for each programming voltage.

20. The method of claim 15, further including:
outputting the latched data value to a test register; and
outputting the data value from the test register via an external connection of an integrated circuit device containing the programmable latch circuit.

* * * * *